(12) United States Patent
Kaneda

(10) Patent No.: US 11,916,351 B2
(45) Date of Patent: Feb. 27, 2024

(54) METHODS AND SYSTEMS FOR IMPROVING SINGLE-FREQUENCY OPERATIONS OF DIODE LASERS

(71) Applicant: Arizona Board of Regents on Behalf of the University of Arizona, Tucson, AZ (US)

(72) Inventor: Yushi Kaneda, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 494 days.

(21) Appl. No.: 17/263,686

(22) PCT Filed: Jul. 26, 2019

(86) PCT No.: PCT/US2019/043636
§ 371 (c)(1),
(2) Date: Jan. 27, 2021

(87) PCT Pub. No.: WO2020/023860
PCT Pub. Date: Jan. 30, 2020

(65) Prior Publication Data
US 2021/0296856 A1 Sep. 23, 2021

Related U.S. Application Data

(60) Provisional application No. 62/711,017, filed on Jul. 27, 2018.

(51) Int. Cl.
*H01S 5/06* (2006.01)
*H01S 5/00* (2006.01)
(Continued)

(52) U.S. Cl.
CPC .......... *H01S 5/0092* (2013.01); *H01S 5/0617* (2013.01); *H01S 5/0653* (2013.01);
(Continued)

(58) Field of Classification Search
CPC ...... G02F 1/3507; G02F 1/354; H01S 5/0092; H01S 5/024; H01S 5/0617; H01S 5/0653; H01S 5/06808
See application file for complete search history.

(56) References Cited

U.S. PATENT DOCUMENTS 4,620,307 A * 10/1986 Kappeler ................. H01S 5/10
372/50.1
6,188,705 B1 2/2001 Krainak et al.
(Continued)

OTHER PUBLICATIONS

International Search Report and Written Opinion dated Oct. 22, 2019 for International Patent Application No. PCT/US2019/043636, filed Jul. 26, 2019 (9 pages).

*Primary Examiner* — Daniel Petkovsek
(74) *Attorney, Agent, or Firm* — Perkins Coie LLP

(57) ABSTRACT

Methods, devices and systems for improving single-frequency operation of diode lasers are described. One such method includes ramping up an operational current of a diode laser for a first predetermined number of steps, and measuring an associated current value indicative of optical power within the laser diode for each of the first predetermined number of steps. Next, operational current of the diode laser is ramped down for a second predetermined number of steps, and an associated current value indicative of optical power within the laser diode is measured for each of the second predetermined number of steps. Using the measured data current values at which a mode hop or a multimode operation is likely to occur are identified, and a contiguous range of operating currents that is devoid of identified likely mode hops or multimode regions of operation is determined as the operating current range of the diode laser.

21 Claims, 8 Drawing Sheets

(51) Int. Cl.
  *H01S 5/065* (2006.01)
  *H01S 5/068* (2006.01)
  *H01S 5/14* (2006.01)
  *G02F 1/35* (2006.01)
  *G02F 1/355* (2006.01)

(52) U.S. Cl.
  CPC .......... *H01S 5/06808* (2013.01); *H01S 5/141* (2013.01); *G02F 1/354* (2021.01); *G02F 1/3507* (2021.01); *G02F 1/3551* (2013.01)

(56) References Cited

U.S. PATENT DOCUMENTS

| | | | |
|---|---|---|---|
| 6,683,895 B2 * | 1/2004 | Pilgrim | H01S 5/141 372/99 |
| 8,675,695 B2 * | 3/2014 | Smith | H01S 5/141 372/18 |
| 9,705,278 B2 * | 7/2017 | Fathololoumi | H01S 5/141 |
| 2006/0109873 A1 * | 5/2006 | Crosson | H01S 5/141 372/19 |
| 2008/0107431 A1 | 5/2008 | Lee et al. | |
| 2008/0310465 A1 | 12/2008 | Achtenhagen | |
| 2009/0097507 A1 | 4/2009 | Zhu et al. | |
| 2009/0323737 A1 * | 12/2009 | Ensher | H01S 5/141 372/102 |
| 2012/0287491 A1 | 11/2012 | Smith et al. | |
| 2016/0126381 A1 | 5/2016 | Wang et al. | |
| 2017/0059403 A1 | 3/2017 | Froehlich et al. | |

* cited by examiner

500

```
┌─────────────────────────────────────────────────────────────────┐
│ Turn on a temperature control unit and wait for the temperature │
│ to stabilize                                                    │
│                              502                                │
└─────────────────────────────────────────────────────────────────┘
                                 ▼
┌─────────────────────────────────────────────────────────────────┐
│  Ramp up the operating current of the ECDL for a first          │
│  predetermined number of discrete steps to span a particular    │
│  ranges of operating currents                                   │
│                              504                                │
└─────────────────────────────────────────────────────────────────┘
                                 ▼
┌─────────────────────────────────────────────────────────────────┐
│ Measure and store current values indicative of optical power    │
│ within the ECDL corresponding to each of the first              │
│ predetermined number of discrete steps                          │
│                              506                                │
└─────────────────────────────────────────────────────────────────┘
                                 ▼
┌─────────────────────────────────────────────────────────────────┐
│ Ramp down the operating current of the ECDL for a second        │
│ predetermined number of discrete steps to span the particular   │
│ ranges of operating currents                                    │
│                              508                                │
└─────────────────────────────────────────────────────────────────┘
                                 ▼
┌─────────────────────────────────────────────────────────────────┐
│ Measure and store current values indicative of optical power    │
│ inside the ECDL corresponding to each of the second             │
│ predetermined number of discrete steps                          │
│                              510                                │
└─────────────────────────────────────────────────────────────────┘
                                 ▼
┌─────────────────────────────────────────────────────────────────┐
│ Determine current values at which a mode hop or a multimode     │
│ operation is likely to occur                                    │
│                              512                                │
└─────────────────────────────────────────────────────────────────┘
                                 ▼
┌─────────────────────────────────────────────────────────────────┐
│ Determine largest contiguous single-frequency range of          │
│ operating currents based on the determined current values by    │
│ excluding regions at which mode hop or multimode operation is   │
│ likely to occur                                                 │
│                              515                                │
└─────────────────────────────────────────────────────────────────┘
```

FIG. 5

METHODS AND SYSTEMS FOR IMPROVING SINGLE-FREQUENCY OPERATIONS OF DIODE LASERS

CROSS REFERENCE TO RELATED APPLICATIONS

This patent document is a 371 National Phase Application of International Patent Application No. PCT/US2019/043636, filed Jul. 26, 2019, which claims priority to the provisional application with Ser. No. 62/711,017, titled "Methods and Systems for Improving Single-Frequency Operations of Diode Lasers," filed Jul. 27, 2018. The entire contents of the above noted applications are incorporated by reference as part of the disclosure of this document.

FEDERALLY SPONSORED RESEARCH OR DEVELOPMENT

This invention was made with government support under Grant No. W31P4Q-17-C-0072, awarded by ARMY. The government has certain rights in the invention.

TECHNICAL FIELD

The subject matter of this patent document generally relates to lasers, and more particularly to systems, devices and methods for improving the operation of lasers.

BACKGROUND

Single-frequency lasers are lasers that emit monochromatic (or quasi-monochromatic) radiation with a small linewidth and find numerous applications, including but not limited to metrology, interferometry, telecommunications, spectroscopy, and data storage. Single-frequency lasers are also attractive because they can be used for driving resonant enhancement cavities, for nonlinear frequency conversion, and for coherent beam combining. These lasers, and especially, low power laser diodes, can also be prone to mode hopping. That is, the laser may operate at a single frequency but can suddenly shift to a different frequency, due to, for example, temperature changes, variations due to optical feedback, changes in injection current (of a diode laser), and other factors. In some scenarios, the laser may even end up operating in multiple simultaneous frequencies, which is referred to as multimode operation. The result of such mode hopping and/or multimode operation is often undesirable because it causes fluctuations in the output frequency and output optical power, and can result in a noisy output beam.

BRIEF DESCRIPTION OF THE DRAWINGS

FIG. 5 illustrates a set of operations that can be carried out to identify a region of single frequency operation of an ECDL in accordance with an exemplary embodiment.

SUMMARY OF CERTAIN EMBODIMENTS

The disclosed embodiments relate to methods, devices and systems that, among other features and benefits, enable stable single-frequency operation of a diode laser. In a particular example, the disclosed technology is used in conjunction with an External Cavity Diode Laser (ECDL). ECDLs typically emit single-frequency radiation at an output power of tens of milliwatt (mW) but are prone to mode hopping and multimode operation.

One aspect of the disclosed embodiments relates to a method for determining a single-frequency operating current of a diode laser. The method includes (a) ramping up an operational current of the diode laser for a first predetermined number of steps, and measuring an associated current value indicative of optical power within the laser diode for each of the first predetermined number of steps. For example, the associated current can be the current of a monitor (or back) photo diode. The method further includes (b) ramping down the operational current of the diode laser for a second predetermined number of steps, and measuring an associated current value indicative of optical power within the laser diode for each of the second predetermined number of steps; (c) using measured data obtained in operations (a) and (b) to identify current values at which a mode hop or a multimode operation is likely to occur; and (d) determining a contiguous range of operating currents that is devoid of identified likely mode hops or multimode regions of operation as the operating current range of the diode laser having a single-frequency output

DETAILED DESCRIPTION

In the following description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

The disclosed technology relates to methods, devices and systems that enable stable single-frequency operation of a diode laser. In a particular example, the disclosed technology is used in conjunction with an External Cavity Diode Laser (ECDL). ECDLs typically emit single-frequency radiation at an output power of tens of milliwatt (mW), but are prone to mode hopping and multimode operation.

Figure 1:
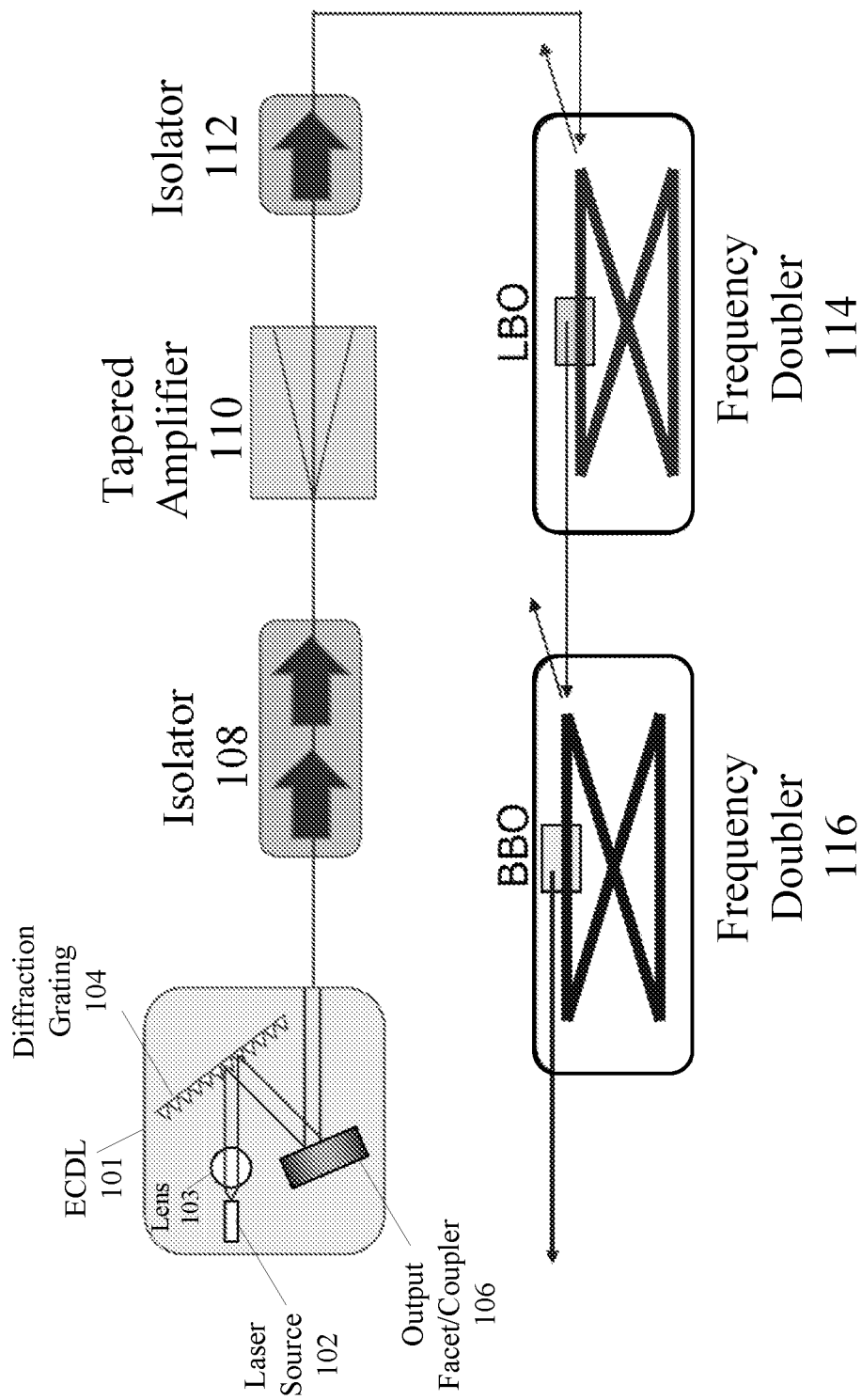
FIG. 1 illustrates configuration of an External Cavity Diode Laser (ECDL) that is used with an external amplifier and frequency doubling components in accordance with an exemplary embodiment.

FIG. 1 shows an exemplary configuration of an ECDL that is used with an external amplifier and frequency doubling components. The example ECDL 101 includes a laser source 102, a lens 103, a diffraction grating 104, and an output facet and/or coupler 106. In the example shown in FIG. 2, light from the laser source 102 is collimated by the lens 103 and is incident on the diffraction grating 104, and to output facet/coupler 106. The light output from the ECDL 101 is directed to an isolator 108, to a tapered amplifier 110, to another isolator 112, and to frequency doubling units 114, 116. The tapered amplifier 110 increases the power of the light output from ECDL 101 to, for example, multiple Watts. The isolators 108, 112 (e.g., Faraday isolators) eliminate or reduce optical feedback. The external resonant doublers 114, 116 include non-linear crystals, such as lithium triborate (LBO), and Barium borate (BBO), and convert the laser light to shorter wavelengths. For example, the laser light can change from 976 nm to 488 nm and then to 244 nm. It should be noted that the configuration of FIG. 1 is provided by the way of example, and not by limitation, to facilitate the understanding of the disclosed technology.

In the configuration of FIG. 1, it is highly desirable to prevent mode hopping and multimode operation of the ECDL 101. It has been observed that in configurations such as those in FIG. 1, the inclusion of subsequent components (e.g., the tapered amplifier 110) can trigger or exacerbate mode hopping and multimode operation despite having isolators 108, 112 that purportedly eliminate optical feedback. In fact, in the configuration of FIG. 1, the presence of the tapered amplifier appears to trigger mode hopping even when a 60 dB isolator is used.

Figure 2:
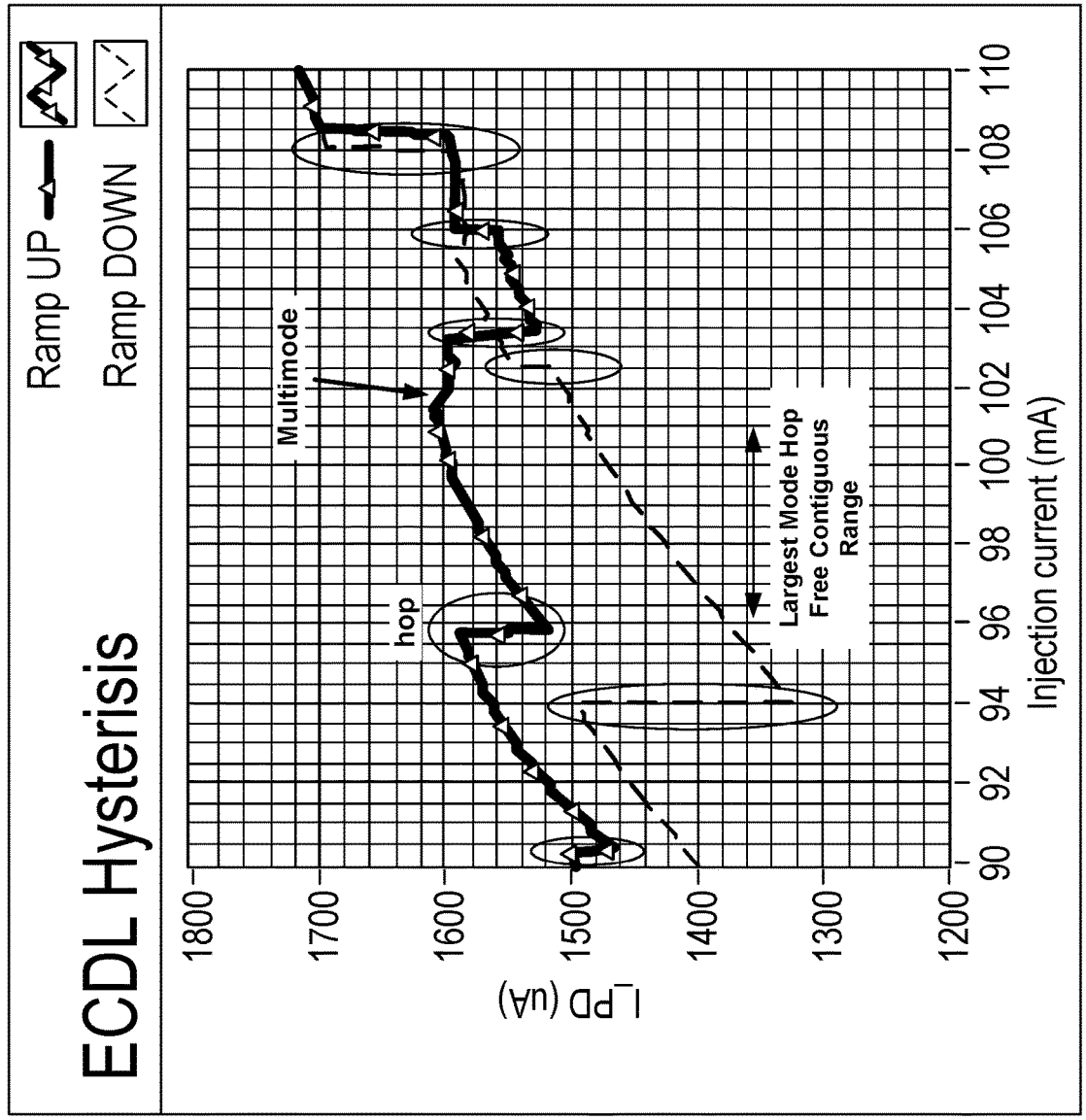
FIG. 2 illustrates a hysteresis plot for an exemplary ECDL to illustrate mode hopping and multimode operation.
Figure 3:
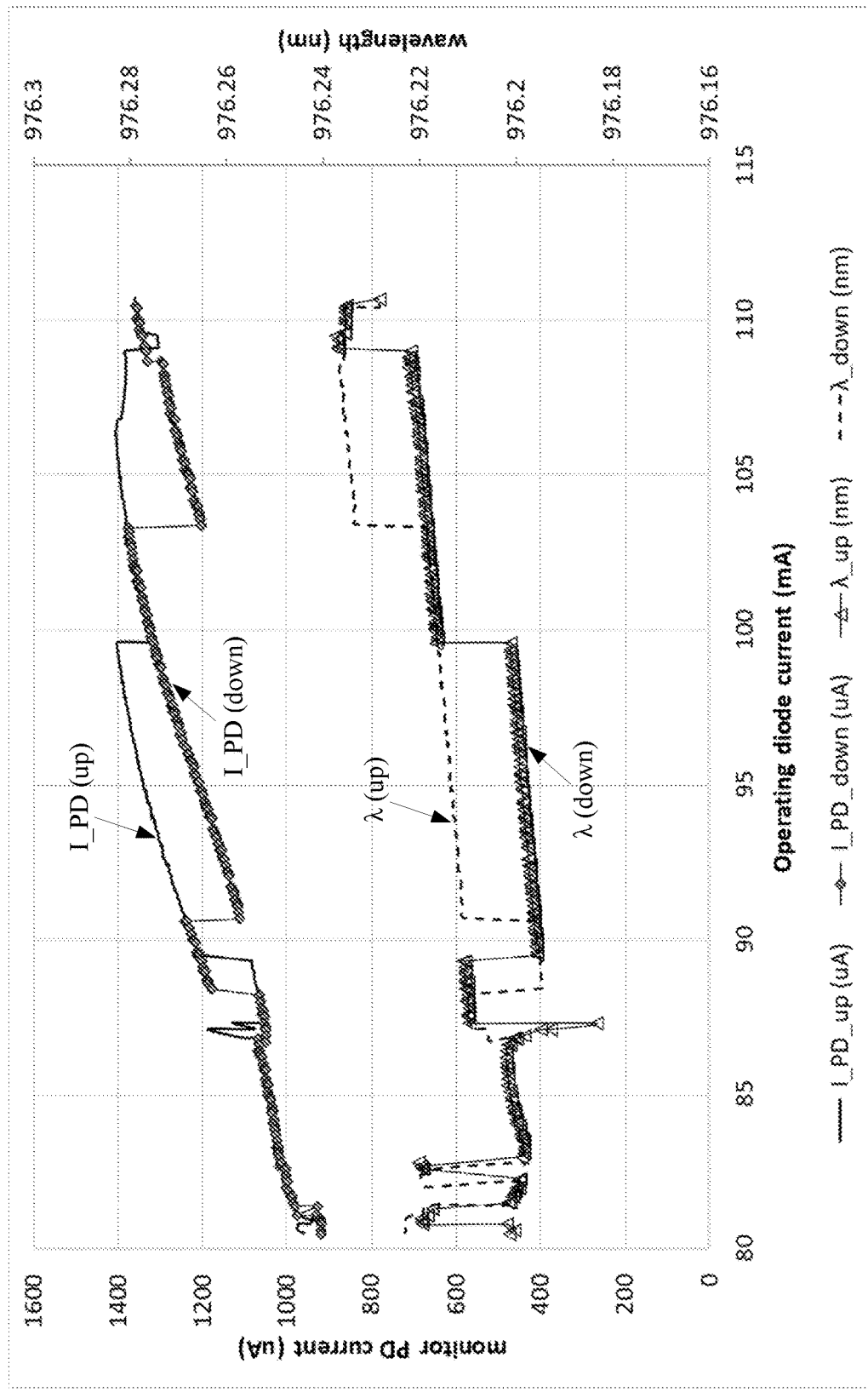
FIG. 3 is another hysteresis plot illustrating changes in a monitor photodiode current and EDCL output wavelength to illustrate mode hopping and multimode operation.

The disclosed embodiments facilitate single frequency operation of an ECDL at least in-part by relying on measured hysteresis data associated with the ECDL. FIG. 2 illustrates an exemplary hysteresis plot for an ECDL when the injection current is increased ("ramp up") from 90 mA to 110 mA in steps of 0.1 mA, and is then decreased back to 90 mA ("ramp down") in 0.1 mA steps. As evident from FIG. 2, the ramp up plot includes five sharp discontinuities (identified with ellipses), and the ramp down plot includes three sharp discontinuities (identified with ellipses). Each discontinuity corresponds to a mode hop from one frequency to a different frequency. In some example ECDL systems, the mode hops are separated by 0.01 to 0.015 nm in wavelength. Another hysteresis data for one such example ECDL system is shown in FIG. 3 corresponding to measurements conducted for a laser at 976 nm. FIG. 3 shows both the monitor photodiode current and changes in laser's output wavelength as a function of operating diode current. The discontinuities in the plots of FIG. 3 are indicative of mode hops and/or multimode operations of the EDCL.

Referring back to FIG. 2, the ramp up plot also includes an area (pointed to by an arrow), where the plot exhibits a negative slope followed by a relatively flat area, which is indicative of multimode operation. As will be described in detail below, the hysteresis data can be obtained for the ECDL operating at a particular temperature; the hysteresis data is then analyzed to determine an operating current for frequency-stable operation of the ECDL.

Figure 4:
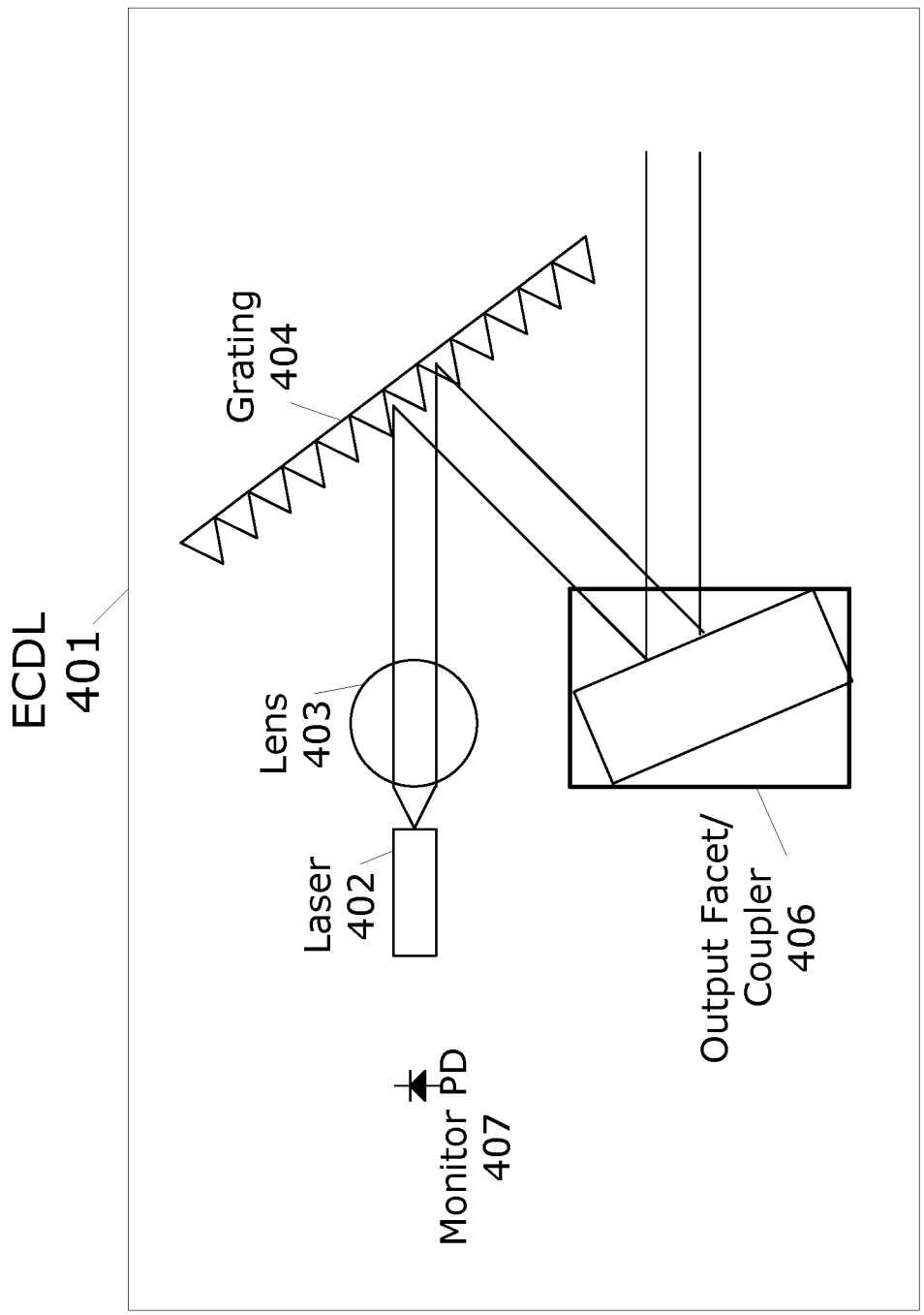
FIG. 4 illustrates another example ECDL configuration that includes a back photodiode or a monitor photodiode.

The vertical axis in FIG. 2 is labeled I_PD, which represents the measured current of the back photodiode in the ECDL. FIG. 4 illustrates an example ECDL configuration 401 including the back photodiode (or monitor PD) 407. Measurements of the monitor photodiode 407 enables identification of mode hopping and multimode operation with more sensitivity because such measurements are reflective of optical power inside ECDL 401, which is strongly influenced by the wavelength sensitive optical feedback such as from diffraction grating 404. Thus, monitoring the back photodiode current provides for better identification of regions of operation of the ECDL 401 that are prone to instability. FIG. 4 also illustrates a lens 403 that is positioned to receive the output of the laser 402 and, in the example configuration of FIG. 4, to provide a collimated beam that is incident on the grating 404 that operates in reflection to provide a diffracted beam to the output facet and/or output coupler 406.

FIG. 5 illustrates a set of operations 500 that can be carried out to identify a region of single frequency operation of an ECDL in accordance with an exemplary embodiment. At 502, a temperature control unit is configured (e.g., through commands received from a processor, via a user interface or the like) to turn on and maintain the temperature of the ECDL at a particular temperature value. After the temperature is stabilized, at 504, the operating current of the ECDL is ramped up for a first number of predetermined steps that span a particular range of operating currents. For example, as noted above, the operating current can be ramped up at 0.1 mA increments in the range 90 mA to 110 mA (corresponding to 200 steps). The above numerical values are provided as examples, and the operating current range and the number of steps can be modified to cover, for example, the entire operating range of the ECDL at any desired level of granularity.

Referring to FIG. 5, at 506, photodiode current values indicative of optical power within the ECDL corresponding to each of the first predetermined number of steps is measured and stored. As noted earlier, these measurements can be taken from the monitor photodiode. It is understood that while operations 504 and 506 are illustrated in separate blocks in FIG. 5, in a typical scenario, the two operations are combined such that after each step in operation 504, the corresponding current value is measured and stored before operating the ECDL at the next operating current value. In some implementations, some or all of the measured values obtained at 504 are stored in a temporary memory (or a buffer) and are then transferred to a main memory for persistent storage. At operations 508 and 510 in FIG. 5, the operating current of the ECDL is ramped down for a second predetermined number of discrete steps, while the current values indicative of optical power inside the ECDL corresponding to the second predetermined number of steps are measured and stored. In general, the first predetermined number of steps at 504 can be the same as the second predetermined number of steps at 508 (e.g., both are equal to 200 steps in the above example). However, in some implementations, the two numbers may be different. For example, one or two fewer data points (e.g., at one or both edges of the measurement range) can be collected as part of the ramp up or ramp down data collection to avoid collection duplicate information. At the completion of operation 510, the measurement of hysteresis data for a particular temperature is completed.

At 512, the current values at which a mode hop or a multimode operation of the ECDL is likely to occur are determined. For example, as described in connection with FIG. 2, each abrupt discontinuity in either the ramp up or the ramp down plot can be identified as a mode hop. All such abrupt transitions are characterized by a transition in the sign of the slope of the plot (i.e., either from a positive slope to a negative slope or vice versa). One exemplary algorithm for determining mode hops includes computing the derivative of the plotted data, and determining whether the absolute value of the computed derivative is below a predetermined threshold. The predetermined threshold allows for the noise-induced or otherwise undesirable transitions to be excluded from consideration. In addition, analysis of the collected data as part of operation 512 enables the identification of regions associated with potential multimode operations. To this end, in some example implementations, regions of multimode operation can be identified from the ramp up plot (i.e., when the operating current is being increased) as regions having a negative slope followed by a region that is substantially flat (see, the example shown in FIG. 2).

Referring back to FIG. 5, at 515, a largest contiguous single-frequency range of operating currents is determined based on the collected data as the largest operating current region that excludes potential mode hop and multimode operation points. Following the operations at 515, an initial operating current of the ECDL can be set (not shown) to a current value that is approximately at the midpoint of the contiguous single-frequency range identified in 515.

Figure 6:
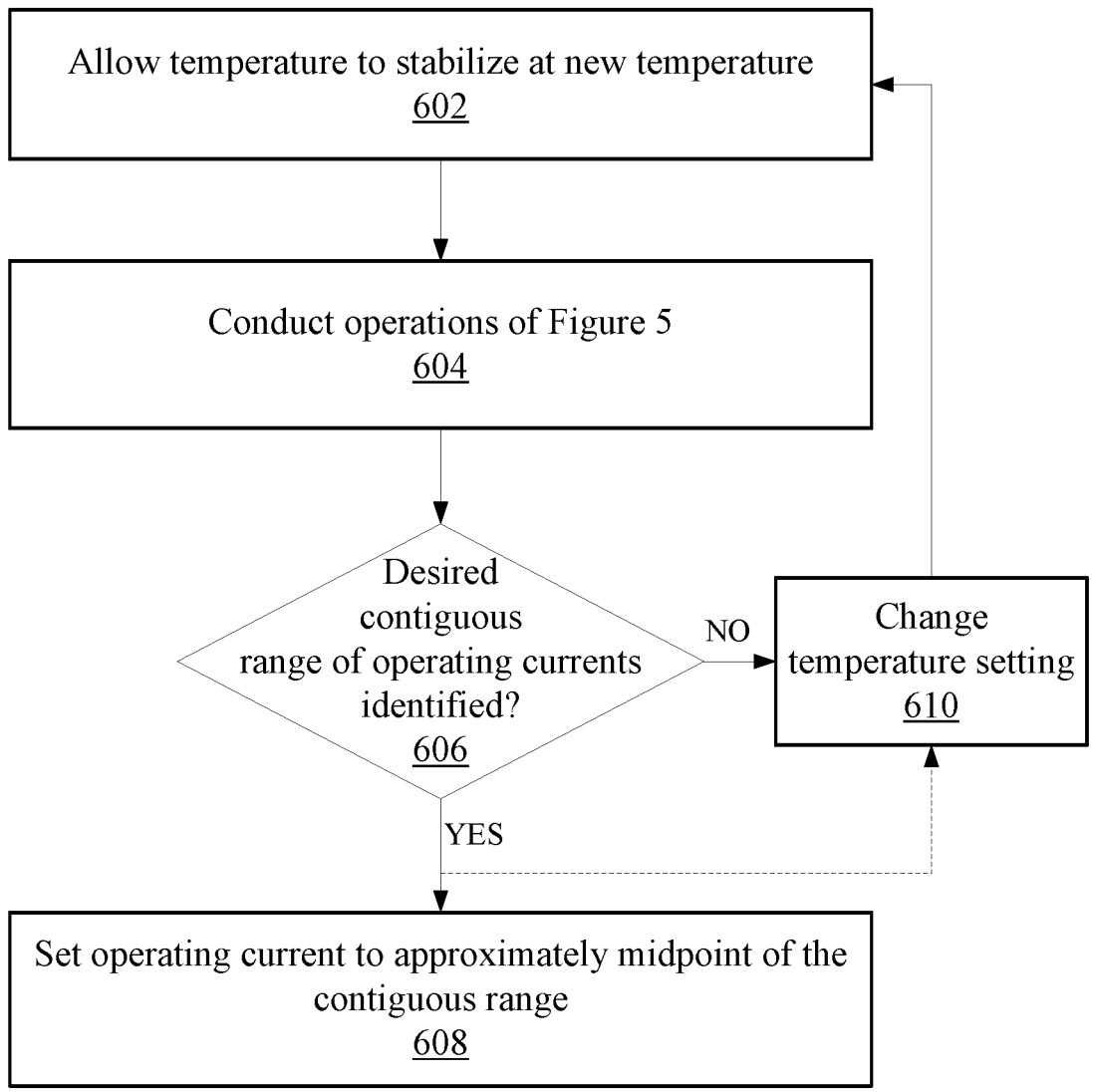
FIG. 6 illustrates a set of operations that can be carried out in some exemplary embodiments to identify an operating current for an ECDL.

FIG. 6 illustrates an additional set of operations 600 that can be carried out in some exemplary embodiments to identify the proper operating current for the ECDL. These operations can be carried out if it is determined that a proper contiguous single-frequency region of operation cannot be identified for a given temperature—e.g., if the largest contiguous operating current range is below a predetermined range, such as less than 3 mA and in some embodiments less than 2 mA. In some instances, operations 600 may be carried out to characterize the ECDL operation at two or more temperature values even if a proper operating current at one temperature value has been identified. At 602, a new temperature value is set and allowed to stabilize. At 604, the operations in FIG. 5 are repeated to identify the contiguous single-frequency region of ECDL operation at the new temperature value. At 606, upon a determination that the contiguous single-frequency region of operation is identified (YES at 606), the operating current of the ECDL is set to approximately the midpoint of the operating current range corresponding to the contiguous single-frequency range of operation. If a desired contiguous single-frequency region is not identified (NO at 606), the temperature setting is changed to a new value at 610, and the operations return to 602. In some implementations, even if the desired contiguous single-frequency region of operation is identified (YES at 606), the operations can optionally return to 610, and then to 602, to collect additional hysteresis information and associated single-frequency operating currents for other temperature values.

It should be noted that the operations in FIGS. 5 and 6 can be carried out for an ECDL as a standalone component, or for a system that includes the ECDL and additional components, including active components such as optical amplifiers (see one example of such a system in FIG. 2).

It is thus evident that the disclosed embodiments allow the identification of an operating range of currents for a diode laser that is devoid of mode hops and regions of multimode operation. By operating the diode laser at such a range of operating currents, a stable, monochromatic output is obtained. While using the disclosed techniques, it may not be possible to achieve a stable output at a desired wavelength, this uncertainty is traded off for achieving a sustained monochromatic output at a nearby wavelength value.

Figure 7:
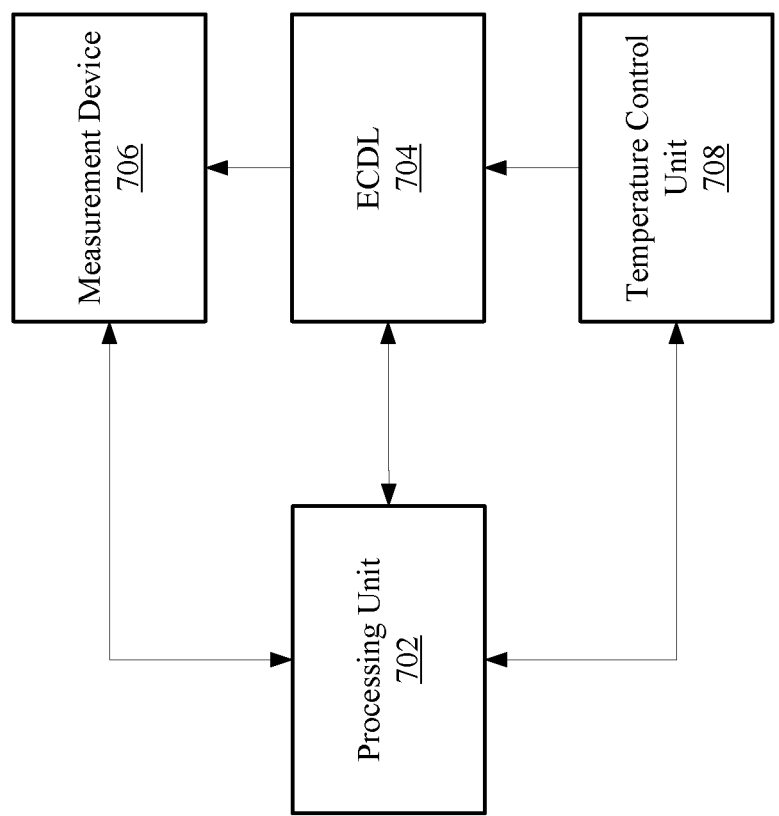
FIG. 7 illustrates a block diagram of a system that enables single-frequency operation of an EDCL in an operating current range in accordance with an exemplary embodiment.

FIG. 7 illustrates a block diagram of a system 700 for determining single-frequency operating current range of an ECDL in accordance with an exemplary embodiment. The system 700 includes an ECDL 704, a processing unit 702 that is communicatively coupled to a measurement device 706 (e.g., a photodetector amplifier, such as a transimpedance amplifier, connected to an A/D convertor, a spectrum analyzer, an oscilloscope, a logic analyzer, a current measurement circuit and the like). The processing unit 702 can, for example, receive measurement data from the measurement device 706, and can issue commands to control an operation of the measurement device 706. The processing unit 702 is also communicatively coupled to a temperature control unit 708 (e.g., a thermoelectric cooler/heater) and can provide temperature setting values and/or associated commands to the temperature control unit 708. The temperature control unit 708 is coupled to the ECDL 704 and can maintain the temperature of the ECDL 704 at a particular temperature value or range of values. The temperature control unit 708 can also provide temperature setting information to the processing unit 702. Alternatively, or additionally, in some implementations, the ECDL 704 can include temperature sensing devices that directly communicate with the processing unit 702. The processing unit 702 can further control certain operations of the ECDL 704, such as turning it off (or on) or controlling modes of operation of the ECDL 704.

Figure 8:
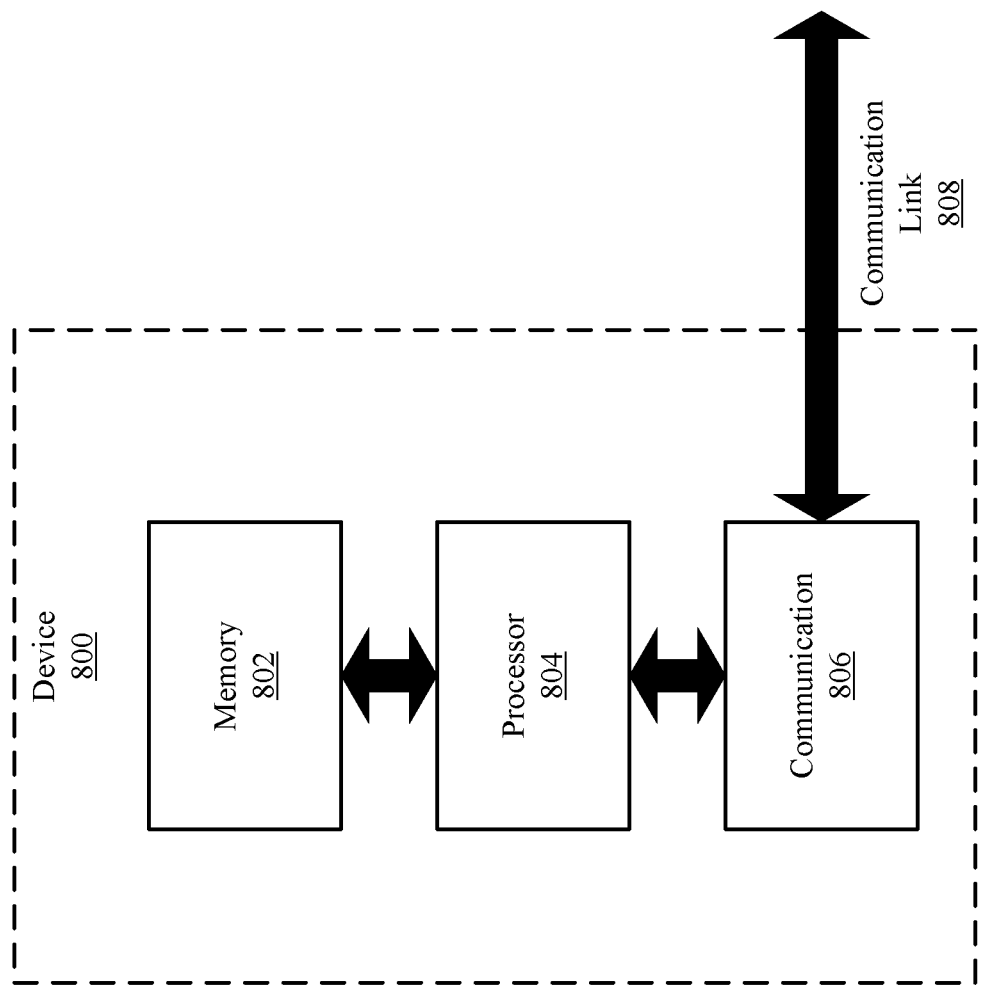
FIG. 8 illustrates a block diagram of a device that can be used to implement certain aspects of the disclosed technology.

FIG. 8 illustrates a block diagram of a device 800 that can be used to implement certain aspects of the disclosed technology. For example, the device 800 of FIG. 8 can be used to receive, process, store, provide for display and/or transmit various data and signals associated with disclosed measurements in any one of, or multiple, devices that are shown in FIG. 7. The device 800 comprises at least one processor 804 and/or controller, at least one memory 802 unit that is in communication with the processor 804, and at least one communication unit 806 that enables the exchange of data and information, directly or indirectly, through the communication link 808 with other entities, devices, databases and networks. The communication unit 806 may provide wired and/or wireless communication capabilities in accordance with one or more communication protocols, and therefore it may comprise the proper transmitter/receiver, antennas, circuitry and ports, as well as the encoding/decoding capabilities that may be necessary for proper transmission and/or reception of data and other information. The exemplary device 800 of FIG. 8 may be integrated as part of larger component (e.g., a computer, tablet, smart phone, etc.).

The processor(s) 804 may include central processing units (CPUs) to control the overall operation of, for example, the host computer. In certain embodiments, the processor(s) 804 accomplish this by executing software or firmware stored in memory 802. The processor(s) 804 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

The memory 802 can be or can include the main memory of a computer system. The memory 802 represents any suitable form of random access memory (RAM), read-only memory (ROM), flash memory, or the like, or a combination of such devices. In use, the memory 802 may contain, among other things, a set of machine instructions which, when executed by processor(s) 804, causes the processor(s) 804 to perform operations to implement certain aspects of the presently disclosed technology.

One aspect of the disclosed embodiments relates to a method for determining a single-frequency operating current of a diode laser that includes (a) ramping up an operational current of the diode laser for a first predetermined number of steps, and measuring an associated current value indicative of optical power within the laser diode for each of the first predetermined number of steps, (b) ramping down the operational current of the diode laser for a second predetermined number of steps, and measuring an associated current value indicative of optical power within the laser diode for each of the second predetermined number of steps, (c) using measured data obtained in operations (a) and (b) to identify current values at which a mode hop or a multimode operation is likely to occur, and (d) determining a contiguous range of operating currents that is devoid of identified likely mode hops or multimode regions of operation as the operating current range of the diode laser having a single-frequency output. In one example, each mode hop is identified as a discontinuity in the current values indicative of the optical power when plotted against the ramped up or the ramped down operating currents of the diode laser. In one implementation, identification of the discontinuity includes computing a derivative. In another example implementation, the multimode operation is identified as a region having a negative slope followed by a region having substantially flat values when the current values indicative of the optical power are plotted against the ramped up operating currents of the diode laser.

In an example embodiment, the diode laser is an external cavity diode laser (ECDL). In another example embodiment, the above noted method further includes setting an initial operating current of the diode laser to an operating current that is approximately at a midpoint of the contiguous range of operating currents. In yet another example embodiment, the measured data obtained in operations (a) and (b) of the above noted method correspond to a first temperature value of the diode laser, and the method includes, prior to conducting operations (a) and (b), setting a temperature of the diode laser to the first temperature value and waiting until a temperature of the diode laser stabilizes at the first temperature value. According to one example, embodiment, upon a determination at operation (d) that the contiguous range of operating currents that is devoid of identified likely mode hops or multimode regions of operation does not span a minimum current range, the above noted method includes setting the temperature of the diode laser to a second temperature value and, upon stabilization of the laser diode temperature, repeating operations (a) to (d) at the second temperature.

In another example embodiment, the first predetermined number of steps is equal to the second predetermined number of steps. In one example embodiment, the associated current values indicative of optical power within the laser diode for each of the first and the second predetermined number of steps are measured using a back photodiode associated with an external cavity diode laser (ECDL). In yet another example embodiment, each mode hop is identified as a discontinuity in the current values indicative of the optical power based on a change in the current values indicative of the optical power as a function of the ramped up or the ramped down operating currents of the diode laser. In one particular embodiment, identification of the discontinuity includes computing a derivative of the current values indicative of the optical power with respect to the ramped up or the ramped down operating currents of the diode laser. In still another example embodiment, the multimode operation is identified as a region having a negative slope followed by a region having substantially flat values for the current values indicative of the optical power as a function the ramped up operating currents of the diode laser.

Another aspect of the disclosed embodiments relates to a system for determining a single-frequency operating current of a diode laser. The system includes a diode laser, a processor, and a memory comprising instructions stored thereupon. The instructions upon execution by the processor cause the processor to provide one or more commands to allow an operational current of the diode laser to ramp up for a first predetermined number of steps, and receive current values indicative of optical power within the laser diode for each of the first predetermined number of steps. The instructions upon execution by the processor further cause the processor to provide one or more commands to allow an operational current of the diode laser to ramp down for a second predetermined number of steps, and to receive current values indicative of optical power within the laser diode for each of the second predetermined number of steps. The instructions upon execution by the processor additionally cause the processor to identify current values at which a mode hop or a multimode operation is likely to occur using the measured data obtained from the received current values for the first and the second predetermined number steps, and to determine a contiguous range of operating currents that is devoid of identified likely mode hops or multimode regions of operation for use as the operating current range of the diode laser having a single-frequency output.

In one example embodiment, the above noted system further includes a current measurement device communicatively coupled to the processor and configured to measure the current values indicative of optical power within the laser diode and to provide the measured current values to the processor. In another example embodiment, the system additionally includes a temperature control unit configured to maintain a temperature of the diode laser at a particular temperature value or range of values. In one example embodiment of the above system, the diode laser is an external cavity diode laser (ECDL). According to another example embodiment, the ECDL includes a diffraction element and an output coupler, wherein the diffraction element is positioned to receive an optical beam produced by the diode laser and to provide a diffracted optical beam to the output coupler. In another example embodiment, the EDCL further includes a lens positioned between the diode laser and the diffraction element.

According to another example embodiment, the system further includes an optical amplifier coupled to the diode laser. In yet another embodiment, the system includes one or more externally resonant non-linear frequency doubling units. In still another example embodiment, the instructions upon execution by the processor further cause the processor to set an initial operating current of the diode laser to an operating current that is approximately at a midpoint of the contiguous range of operating currents. In another example embodiment, the instructions upon execution by the processor further cause the processor to identify a mode hop as a discontinuity in the current values indicative of the optical power based on a change in the current values indicative of the optical power as a function of the ramped up or the ramped down operating currents of the diode laser.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Aspects of the subject matter described in this specification can be implemented as one or more computer program products, e.g., one or more modules of computer program instructions encoded on a tangible and non-transitory computer readable medium for execution by, or to control the operation of, data processing apparatus. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. While operations are depicted in the drawings in a particular order, this should not be understood as requiring that such operations be performed in the particular order shown or in sequential order, or that all illustrated operations be performed, to achieve desirable results. The features of the embodiments described herein may be combined in all possible combinations of methods, apparatus, modules, and systems.

What is claimed is:

1. A method for determining a single-frequency operating current of a diode laser, comprising:
    (a) ramping up an operational current of the diode laser for a first predetermined number of steps, and measuring an associated current value indicative of optical power within the laser diode for each of the first predetermined number of steps;
    (b) ramping down the operational current of the diode laser for a second predetermined number of steps, and measuring an associated current value indicative of optical power within the laser diode for each of the second predetermined number of steps;
    (c) using measured data obtained in operations (a) and (b) to identify current values at which a mode hop or a multimode operation is likely to occur; and
    (d) determining a contiguous range of operating currents that is devoid of identified likely mode hops or multimode regions of operation as the operating current range of the diode laser having a single-frequency output, wherein the multimode operation is identified as a region having a negative slope followed by a region having substantially flat values for the current values indicative of the optical power as a function of the ramped up operating currents of the diode laser.

2. The method of claim 1, wherein the diode laser is an external cavity diode laser (ECDL).

3. The method of claim 1, further including setting an initial operating current of the diode laser to an operating current that is approximately at a midpoint of the contiguous range of operating currents.

4. The method of claim 1, wherein the first predetermined number of steps is equal to the second predetermined number of steps.

5. The method of claim 1, wherein the associated current values indicative of optical power within the laser diode for each of the first and the second predetermined number of steps are measured using a back photodiode associated with an external cavity diode laser (ECDL).

6. The method of claim 1, wherein each mode hop is identified as a discontinuity in the current values indicative of the optical power based on a change in the current values indicative of the optical power as a function of the ramped up or the ramped down operating currents of the diode laser.

7. The method of claim 6, wherein identification of the discontinuity includes computing a derivative of the current values indicative of the optical power with respect to the ramped up or the ramped down operating currents of the diode laser.

8. A method for determining a single-frequency operating current of a diode laser, comprising:
    (a) ramping up an operational current of the diode laser for a first predetermined number of steps, and measuring an associated current value indicative of optical power within the laser diode for each of the first predetermined number of steps;
    (b) ramping down the operational current of the diode laser for a second predetermined number of steps, and measuring an associated current value indicative of optical power within the laser diode for each of the second predetermined number of steps;
    (c) using measured data obtained in operations (a) and (b) to identify current values at which a mode hop or a multimode operation is likely to occur; and
    (d) determining a contiguous range of operating currents that is devoid of identified likely mode hops or multimode regions of operation as the operating current range of the diode laser having a single-frequency output,
    wherein the measured data obtained in operations (a) and (b) correspond to a first temperature value of the diode laser, and the method comprises:
    prior to conducting operations (a) and (b), setting a temperature of the diode laser to the first temperature value and waiting until a temperature of the diode laser stabilizes at the first temperature value, and
    upon a determination at operation (d) that the contiguous range of operating currents that is devoid of identified likely mode hops or multimode regions of operation does not span a minimum current range, setting the temperature of the diode laser to a second temperature value and upon stabilization of the laser diode temperature, repeating operations (a) to (d) at the second temperature.

9. The method of claim 8, wherein the multimode operation is identified as a region having a negative slope followed by a region having substantially flat values for the current values indicative of the optical power as a function of the ramped up operating currents of the diode laser.

10. A system for determining a single-frequency operating current of a diode laser, comprising:
    the diode laser;
    a processor; and
    a memory comprising instructions stored thereupon, wherein the instructions upon execution by the processor cause the processor to:
    provide one or more commands to allow an operational current of the diode laser to ramp up for a first predetermined number of steps, and receive current values indicative of optical power within the laser diode for each of the first predetermined number of steps;
    provide one or more commands to allow an operational current of the diode laser to ramp down for a second predetermined number of steps, and receive current values indicative of optical power within the laser diode for each of the second predetermined number of steps;
    identify current values at which a mode hop or a multimode operation is likely to occur using the measured data obtained from the received current values for the first and the second predetermined number steps; and determine a contiguous range of operating currents that is devoid of identified likely mode hops or multimode regions of operation for use as the operating current range of the diode laser having a single-frequency output, wherein the multimode operation is identified as a region having a negative slope followed by a region having substantially flat values for the current values indicative of the optical power as a function of the ramped up operating currents of the diode laser.

11. The system of claim 10, further comprising a current measurement device communicatively coupled to the processor and configured to measure the current values indicative of optical power within the laser diode and to provide the measured current values to the processor.

12. The system of claim 10, further comprising a temperature control unit configured to maintain a temperature of the diode laser at a particular temperature value or range of values.

13. The system of claim 10, wherein the diode laser is an external cavity diode laser (ECDL).

14. The system of claim 13, wherein the ECDL includes a diffraction element and an output coupler, wherein the diffraction element is positioned to receive an optical beam produced by the diode laser and to provide a diffracted optical beam to the output coupler.

15. The system of claim 14, wherein the EDCL further includes a lens positioned between the diode laser and the diffraction element.

16. The system of claim 10, further including an optical amplifier coupled to the diode laser.

17. The system of claim 10, further including one or more externally resonant non-linear frequency doubling units.

18. The system of claim 10, wherein the instructions upon execution by the processor further cause the processor to set an initial operating current of the diode laser to an operating current that is approximately at a midpoint of the contiguous range of operating currents.

19. The system of claim 10, wherein the instructions upon execution by the processor further cause the processor to identify a mode hop as a discontinuity in the current values indicative of the optical power based on a change in the current values indicative of the optical power as a function of the ramped up or the ramped down operating currents of the diode laser.

20. The system of claim 19, wherein identification of the discontinuity includes computing a derivative of the current values indicative of the optical power with respect to the ramped up or the ramped down operating currents of the diode laser.

21. A method for determining a single-frequency operating current of a diode laser, comprising:
(a) ramping up an operational current of the diode laser for a first predetermined number of steps, and measuring an associated current value indicative of optical power within the laser diode for each of the first predetermined number of steps;
(b) ramping down the operational current of the diode laser for a second predetermined number of steps, and measuring an associated current value indicative of optical power within the laser diode for each of the second predetermined number of steps;
(c) using measured data obtained in operations (a) and (b) to identify current values at which a mode hop or a multimode operation is likely to occur; and
(d) determining a contiguous range of operating currents that is devoid of identified likely mode hops or multimode regions of operation as the operating current range of the diode laser having a single-frequency output, wherein the associated current values indicative of optical power within the laser diode for each of the first and the second predetermined number of steps are measured using a back photodiode inside an external cavity diode laser (ECDL).

* * * * *